United States Patent
Chandrasekharan et al.

(10) Patent No.: US 11,183,400 B2
(45) Date of Patent: Nov. 23, 2021

(54) PROGRESSIVE HEATING OF COMPONENTS OF SUBSTRATE PROCESSING SYSTEMS USING TCR ELEMENT-BASED HEATERS

(71) Applicant: Lam Research Corporation, Fremont, CA (US)

(72) Inventors: Ramesh Chandrasekharan, Portland, OR (US); Easwar Srinivasan, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 369 days.

(21) Appl. No.: 16/058,216

(22) Filed: Aug. 8, 2018

(65) Prior Publication Data

US 2020/0051834 A1    Feb. 13, 2020

(51) Int. Cl.
*H01L 21/67* (2006.01)
*H01J 37/32* (2006.01)
*G01K 7/16* (2006.01)

(52) U.S. Cl.
CPC .. *H01L 21/67017* (2013.01); *H01J 37/32724* (2013.01); *H01L 21/67103* (2013.01); *H01L 21/67248* (2013.01); *G01K 7/16* (2013.01); *H01J 2237/24585* (2013.01)

(58) Field of Classification Search
CPC .......... H01L 21/67248; H01L 21/67103; H01J 37/32724; H05B 3/0014; H05B 2203/0019; H05B 2203/02; G01K 7/16
See application file for complete search history.

(56) References Cited

U.S. PATENT DOCUMENTS

| | | | | |
|---|---|---|---|---|
| 4,780,120 A | * | 10/1988 | Varrasso | C03B 37/07 373/28 |
| 5,071,459 A | * | 12/1991 | Kuhn | C03B 37/07 219/483 |
| 5,280,422 A | | 1/1994 | Moe et al. | |

(Continued)

FOREIGN PATENT DOCUMENTS

| JP | H07153550 A | 6/1995 |
|---|---|---|
| JP | H10116885 A | 5/1998 |

(Continued)

OTHER PUBLICATIONS

U.S. Appl. No. 62/694,171, filed Jul. 5, 2018, in the names of Sairam Sundaram et al.; & entitled "Dynamic Temperature Control of Substrate Support in Substrate Processing System", pp. 1-14. (Year 2018).

(Continued)

*Primary Examiner* — John J Norton

(57) ABSTRACT

A heater control system for heating components of a substrate processing system includes N heater zones, where N is an integer greater than zero. Each of the N heater zones heats a component of the substrate processing system and includes a resistive heater and a temperature sensor to sense a local temperature in a corresponding one of the N heater zones. A controller is configured to determine an average temperature of each of the N heater zones based on a resistance of the resistive heater in each of the N heater zones. The controller controls the resistive heater based on the average temperature and the local temperature in each of the N heater zones.

10 Claims, 6 Drawing Sheets

(56) References Cited

U.S. PATENT DOCUMENTS

| | | | |
|---|---|---|---|
| 5,521,850 A | 5/1996 | Moe et al. | |
| 5,968,379 A * | 10/1999 | Zhao | C23C 16/45565 |
| | | | 118/723 I |
| 5,974,816 A * | 11/1999 | Endo | G03F 7/70875 |
| | | | 62/179 |
| 6,072,163 A * | 6/2000 | Armstrong | H01L 21/67103 |
| | | | 219/497 |
| 6,627,859 B1 | 9/2003 | Kasai et al. | |
| 6,951,587 B1 | 10/2005 | Narushima | |
| 7,196,295 B2 | 3/2007 | Fennewald et al. | |
| 8,552,346 B2 | 10/2013 | Ambal et al. | |
| 8,772,682 B2 | 7/2014 | Ambal et al. | |
| 9,123,755 B2 | 9/2015 | Swanson et al. | |
| 2005/0028736 A1 | 2/2005 | Long | |
| 2005/0258160 A1 | 11/2005 | Goto et al. | |
| 2006/0065654 A1 * | 3/2006 | Ptasienski | H05B 3/86 |
| | | | 219/543 |
| 2007/0218200 A1 | 9/2007 | Suzuki et al. | |
| 2008/0224817 A1 * | 9/2008 | Vellore | G01K 1/14 |
| | | | 338/25 |
| 2011/0299562 A1 * | 12/2011 | Hashemian | G01K 7/18 |
| | | | 374/1 |
| 2012/0118225 A1 | 5/2012 | Hsu et al. | |
| 2012/0292305 A1 * | 11/2012 | Ambal | G05D 23/2401 |
| | | | 219/520 |
| 2013/0180963 A1 | 7/2013 | Zhang et al. | |
| 2013/0270252 A1 | 10/2013 | Ambal et al. | |
| 2014/0083361 A1 | 3/2014 | Rocha-Alvarez et al. | |
| 2015/0089961 A1 * | 4/2015 | Duzly | G11C 7/04 |
| | | | 62/3.3 |
| 2015/0253051 A1 * | 9/2015 | Jin | F25B 49/02 |
| | | | 62/56 |
| 2016/0079039 A1 | 3/2016 | Dhindsa et al. | |
| 2016/0148803 A1 * | 5/2016 | Wu | H01L 21/68771 |
| | | | 438/479 |
| 2016/0379851 A1 | 12/2016 | Swaminathan et al. | |
| 2017/0215230 A1 | 7/2017 | Parkhe | |
| 2017/0236733 A1 | 8/2017 | Leeser | |
| 2017/0280509 A1 | 9/2017 | Takebayashi | |
| 2017/0363663 A1 * | 12/2017 | Breitlow | H05B 1/0233 |
| 2017/0372928 A1 | 12/2017 | Yamada et al. | |
| 2018/0090306 A1 | 3/2018 | Higashijima et al. | |
| 2018/0190529 A1 | 7/2018 | Takebayashi et al. | |
| 2018/0246163 A1 * | 8/2018 | Kwak | H01L 22/34 |
| 2018/0348265 A1 | 12/2018 | Hopkins-Breitlow et al. | |

FOREIGN PATENT DOCUMENTS

| | | |
|---|---|---|
| JP | 2000235886 A | 8/2000 |
| JP | 2000339039 A | 12/2000 |
| JP | 5567318 B2 | 8/2014 |
| JP | 2017076691 A | 4/2017 |
| JP | 2017228230 A | 12/2017 |
| KR | 20-2009-0003703 U | 4/2009 |
| KR | 10-2017-0088352 A | 8/2017 |
| KR | 10-2018-0035151 A | 4/2018 |
| WO | WO-2018016384 A1 | 1/2018 |

OTHER PUBLICATIONS

International Search Report and Written Opinion corresponding to PCT/US2019/030366 dated Aug. 13, 2019, 13 pages.

International Search Report and Written Opinion corresponding to PCT/US2019/045093 dated Nov. 15, 2019, 14 pages.

International Search Report and Written Opinion corresponding to PCT/US2019/045097 dated Dec. 20, 2019, 11 pages.

International Search Report and Written Opinion corresponding to PCT/US2018/061542 dated Mar. 8, 2019, 10 pages.

International Search Report and Written Opinion corresponding to PCT/US2019/040416 dated Oct. 23, 2019, 12 pages.

* cited by examiner

PROGRESSIVE HEATING OF COMPONENTS OF SUBSTRATE PROCESSING SYSTEMS USING TCR ELEMENT-BASED HEATERS

FIELD

The present disclosure relates to substrate processing systems, and more particularly to progressive heating of components of substrate processing systems using both thermocouples and temperature coefficient of resistance (TCR) heaters.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, chemical vapor deposition (CVD), plasma enhanced chemical vapor deposition (PECVD), atomic layer deposition (ALD), atomic layer etch (ALE), plasma enhanced atomic layer deposition (PEALD) and/or other etch, deposition, and cleaning processes. During processing, a substrate is arranged on a substrate support, such as a pedestal, an electrostatic chuck (ESC), etc. in a processing chamber of the substrate processing system. A process gas mixture is introduced into the processing chamber to treat the substrate. In some examples, plasma may be struck to enhance chemical reactions within the processing chamber.

Gas supply lines supply gas mixtures to the processing chamber. If the temperature of the gas mixtures in the gas supply lines is not carefully controlled, condensation of the gas mixture may occur on walls of the gas supply lines. The condensation of the gas mixture may cause defects and is often difficult to remove.

SUMMARY

A heater control system for heating components of a substrate processing system includes N heater zones, where N is an integer greater than zero. Each of the N heater zones heats a component of the substrate processing system and includes a resistive heater and a temperature sensor to sense a local temperature in a corresponding one of the N heater zones. A controller is configured to determine an average temperature of each of the N heater zones based on a resistance of the resistive heater in each of the N heater zones. The controller controls the resistive heater based on the average temperature and the local temperature in each of the N heater zones.

In other features, the controller is configured to selectively control power supplied to the resistive heater in each of the N heater zones based on the local temperature and selectively override power supplied to the resistive heater in each of the N heater zones based on the average temperature.

In other features, the controller is configured to selectively control power supplied to the resistive heater in each of the N heater zones based on the average temperature and selectively override power supplied to the resistive heater in each of the N heater zones based on the local temperature.

In other features, a current sensor senses current supplied to each of the N heater zones. The controller determines the resistance of each of the N heater zones based thereon.

In other features, a voltage sensor senses voltage supplied to each of the N heater zones. The controller determines the resistance of each of the N heater zones based thereon.

In other features, a heater driver drives one of the N heater zones based on a duty cycle. A resistance estimator estimates the resistance of the one of the N heater zones based on the duty cycle. The controller determines the local temperature of the one of the N heater zones based on the resistance.

In other features, the controller is configured to selectively control power supplied to the resistive heater in each of the N heater zones based on the local temperature and selectively override power supplied to the resistive heater in each of the N heater zones when the average temperature is outside of a predetermined temperature range.

In other features, the controller is configured to control the power supplied to the resistive heater in each of the N heater zones based on at least one of a default duty cycle and a default power level when the average temperature is outside of the predetermined temperature range.

In other features, the controller is configured to selectively control power supplied to the resistive heater in each of the N heater zones based on the average temperature and selectively override power supplied to the resistive heater in each of the N heater zones based on the local temperature.

In other features, the controller is configured to increase power supplied to the resistive heater in each of the N heater zones when the local temperature is less than a predetermined temperature.

In other features, the N heater zones are arranged around gas lines from a source to a processing chamber. The N heater zones provide a progressive heating profile from the source to the processing chamber.

A heater control system for a gas delivery system of a substrate processing system includes an oven to enclose one or more components of the substrate processing system and to maintain a predetermined temperature in the oven. N resistive heaters are arranged inside of the oven where N is an integer greater than one. Each of the N resistive heaters selectively heats at least a portion of one of the components in the oven. The N resistive heaters are uninsulated. A controller is configured to maintain the predetermined temperature in localized regions in the oven by determining a resistance in each of the N resistive heaters and adjusting power to each of the N resistive heaters based on N−1 resistance ratios of N−1 of the N resistive heaters relative to one of the N resistive heaters.

In other features, a first temperature sensor is located remotely from the N resistive heaters to sense a temperature in the oven. The oven includes a heating element. The controller determines an average temperature in the oven based on the first temperature sensor and controls the heating element of the oven based thereon to maintain the predetermined temperature.

In other features, the N−1 resistance ratios are determined at the predetermined temperature. The predetermined temperature is ambient temperature. The controller is further configured to adjust the N−1 resistance ratios to provide progressive heating. The components comprise at least one of gas lines and valves in a gas flow path.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
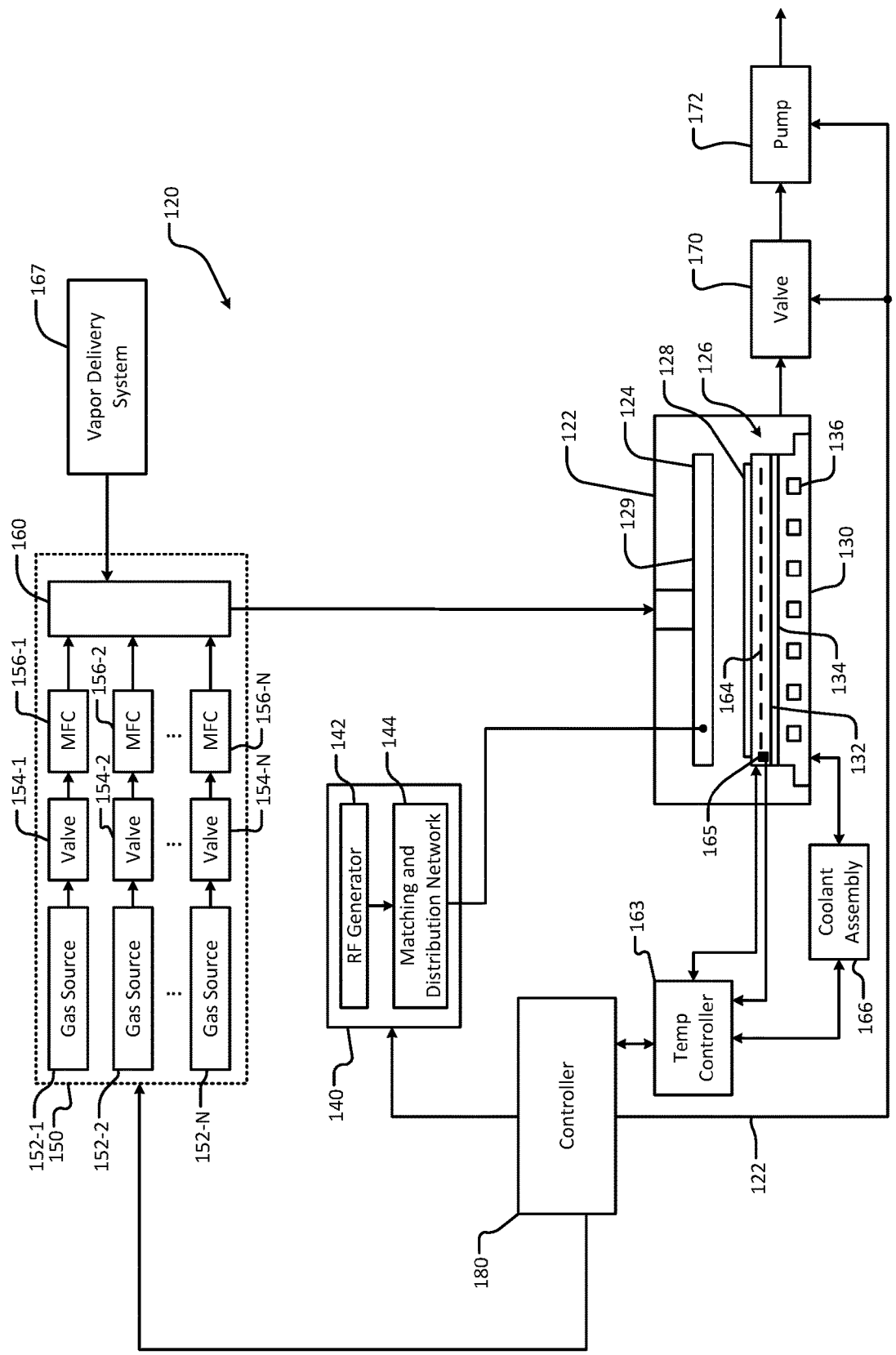
FIG. 1 is a functional block diagram of an example of a substrate processing system according to the present disclosure.

Progressive heating may be used to overcome condensation risks in gas lines. However, the temperature measured at one location along a gas line using a thermocouple does not capture load-based changes across the entire heater zone. Pressure transitions and/or load changes due to expansions, valves, etc. can cause local temperature changes. Additionally, tubes/heaters that are designed for one application are often used for another and the temperature distribution may change. If a thermocouple (TC) is located at a pressure drop/expansion location, the thermocouple will sense a low temperature and the gas line may be heated hotter than desired. If the thermocouple is located away from the pressure drop, localized cooling may occur. One possible solution is to increase the number of heater zones. This approach, however, adds cost and serviceability challenges (due to more connections).

Heating systems for gas delivery systems according to the present disclosure use a heater including a TCR heater element. In some examples, the TCR heater element has a high TCR that is greater than 0.001 ppm/° C. For example only, molybdenum or tungsten (W) heater elements may be used. In other examples, the TCR heater element has a lower TCR that is less than 0.001 ppm/° C. For example only, copper or nickel can be used.

A resistance of the TCR-based heater can be measured to provide an average temperature in the heater zone. A controller may be used to relate resistance to temperature using a lookup table or formula. Temperature is also monitored in each zone using a TC to provide a local temperature (representing a point location in the heater zone). In some examples, the TC is located at either a starting position or ending position of the heater zone to measure a sensed temperature at that location. As will be described further below, a combination of primary control and secondary override/monitoring is performed using the feedback from the TCR heater and the TC in each heater zone.

In a first approach, the temperature that is sensed by the TC is used as a control set point for the heater zone and the average temperature that is sensed by the TCR heater is used as monitor/override. If the average temperature of the heater zone falls below or goes above a particular value, the controller uses a default duty cycle. The acceptable ranges of the average values can be assigned on a per zone basis to cascade progressively or monotonically increase along the gas flow path. In some examples, the TCR heaters use high TCR elements. In other examples, the TCR heaters use low TCR elements since the average value is used as a safety check/override.

In a second approach, the average temperature that is sensed by the TCR heater is used as a control variable. The entire heater zone may be heated hotter if there is a local temperature drop due to expansion related cooling in one section of the heater zone. In some examples, the local TC is arranged close to expansion points to monitor and override if needed. If there is cooling at the location monitored by the TC, a limit stop is triggered and heat is added preemptively.

In both methods, the average temperature ensures progressive heating. The local temperature measurements from the TC enable the heating system to react to local changes. The control systems described above prevent overreaction by the heating system, which may cause overheating in the heater zones.

In some examples, fewer heater zones are used to cover larger areas. In other examples, the TCs are arranged only at expected expansion zones to address specific condensation risks while he rest of the heating area is part of a single large zone.

Referring now to FIG. 1, an example substrate processing system 120 is shown. While a processing chamber for chemical vapor deposition (CVD) or atomic layer deposition (ALD) using capacitively coupled plasma (CCP) is shown for purposes of illustration, any other type of substrate processing system can be used.

The substrate processing system 120 includes a processing chamber 122 that encloses other components of the substrate processing system 120 and contains the RF plasma (if used). The substrate processing system 120 includes an upper electrode 124 and a substrate support 126 such as an electrostatic chuck (ESC), pedestal, etc. During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

If plasma is used, an RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF generator 142 that generates RF power that is fed by a matching and distribution network 144 to the upper electrode 124 or the baseplate 130. In other examples, the plasma may be generated inductively or remotely.

A gas delivery system 150 includes one or more gas sources 152-1, 152-2, ..., and 152-N (collectively gas sources 152), where N is an integer greater than zero. The gas sources 152 are connected by primary valves 154-1, 154-2, ..., and 154-N (collectively primary valves 154), MFCs 156-1, 156-2, ..., and 156-N (collectively MFCs 156), and/or secondary valves (not shown) to a manifold 160. While a single gas delivery system 150 is shown, two or more gas delivery systems can be used.

Temperature controller 163 is connected to a plurality of resistive heaters 164 arranged in the heating plate 132. The temperature controller 163 may also be connected to one or more thermocouples 165 in the heating plate 132. The temperature controller 163 may be used to control the plurality of resistive heaters 164 to adjust and control a temperature of the substrate support 126 and the substrate 128. In some examples, a vapor delivery system 167 supplies vapor to the processing chamber.

In some examples, the temperature controller 163 and/or another controller may also communicate with a coolant assembly 166 to control coolant flow through the channels 136. For example, the coolant assembly 166 may include a coolant pump, a reservoir and/or one or more thermocouples. In some examples, the temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may be used to control components of the substrate processing system 120.

Figure 2B:
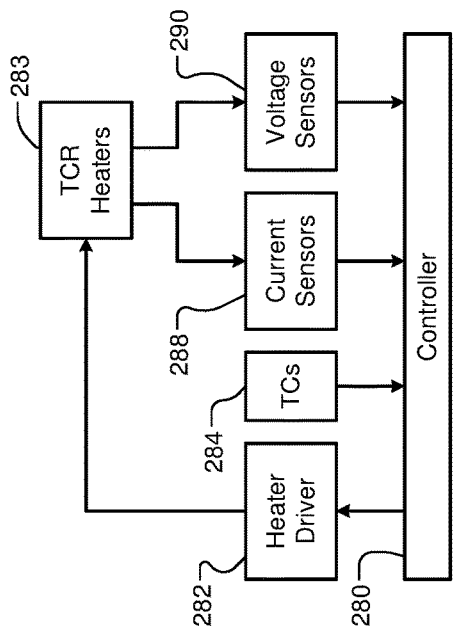
FIGS. 2A to 2C are functional block diagrams of examples of heating systems according to the present disclosure.
Figure 2C:
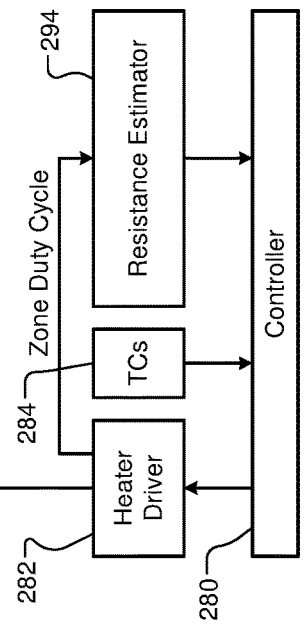
Figure 2A:
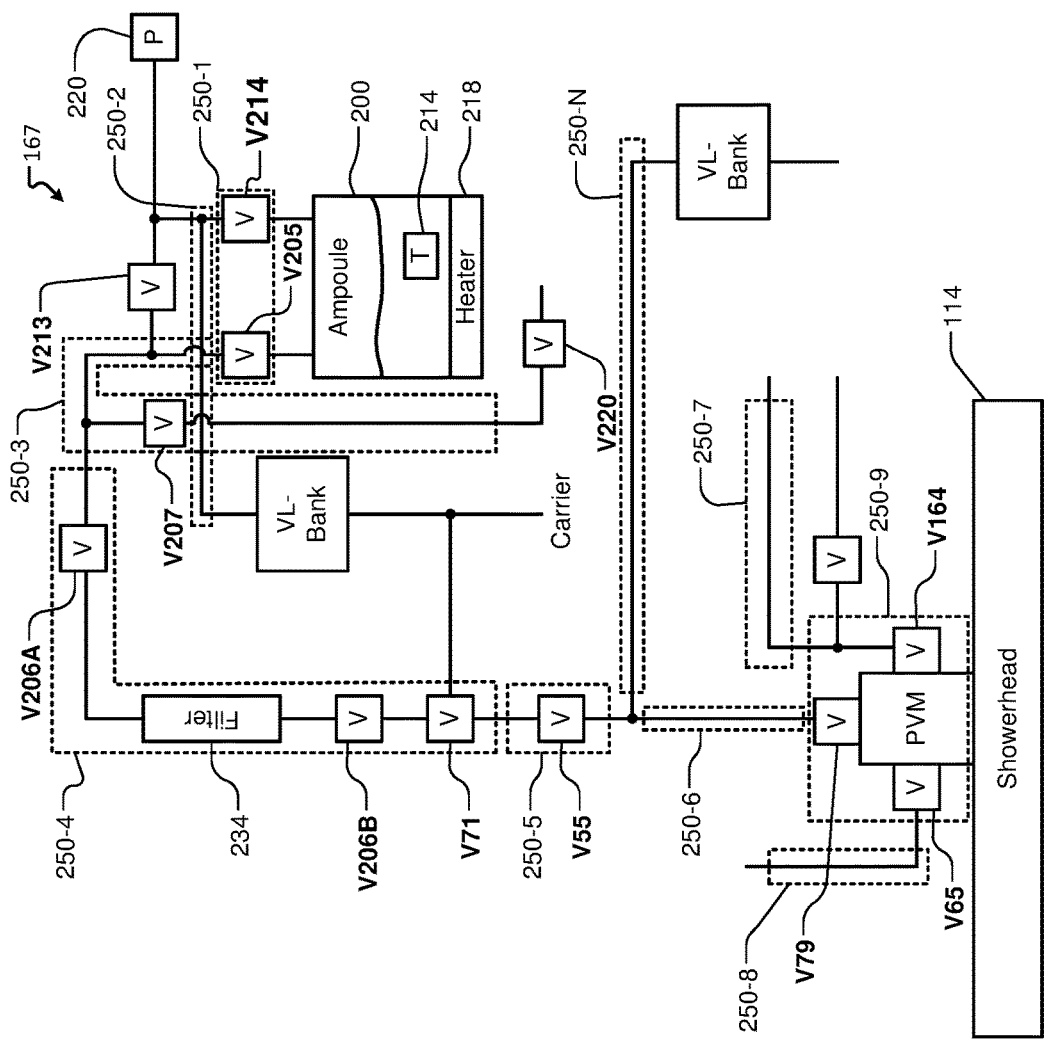

Referring now to FIG. 2A, a heating system for the vapor delivery system 167 according to the present disclosure is shown. While the heating system in FIG. 2 is shown to include an ampoule 200 for supplying vaporized precursor, the heating system can heat other components of a substrate processing system. A temperature sensor 214 monitors a temperature of the precursor. A heater 218 is used to heat the liquid precursor based upon the sensed temperature and a desired temperature. The controller 180 or another controller may be used to monitor the temperature sensor 214 and to control the heater 218 based upon the measured temperature and the desired temperature.

Valves V214, V205 and V213 selectively supply either carrier gas or a mixture of carrier gas and the vaporized precursor to a gas flow path. Additional valves V220, V206A, V206B, V71, V55, V79, V65, V164, and V207 are provided to allow control of gas flow along various gas flow paths. A plurality of heater zones 250-1, 250-2, ..., 250-N (collectively heater zones 250) (where N is an integer greater than one) are used to heat gas lines, valves and/or other components along the gas flow paths.

Referring now to FIG. 2B, the controller 280 may be used to control operation of the heater zones 250. A heater driver 282 may be used to supply power to the TCR heaters 283. One or more temperature sensors or thermocouples 284 may be used to sense temperature in the heater zones 250. Current sensors 288 may be used to sense current supplied to the TCR heaters by the heater driver 282. Voltage sensors 290 may be used to sense voltage supplied to the TCR heaters by the heater driver 282.

Referring now to FIG. 2C, the controller 280 may be used to control operation of the heater zones 250. In this example, the current sensors 288 and the voltage sensors 290 are omitted and a resistance estimator 294 is used to monitor duty cycles of the heater zones 250 and to estimate the resistance of the heater zones 250 based on the corresponding duty cycle. In this example, it is assumed that either the voltage or current is a constant value and the duty cycle of the current or voltage is varied. In other words, the controller 280 estimates resistance based on the known voltage or current and the duty cycle for the current or voltage.

Figure 3:
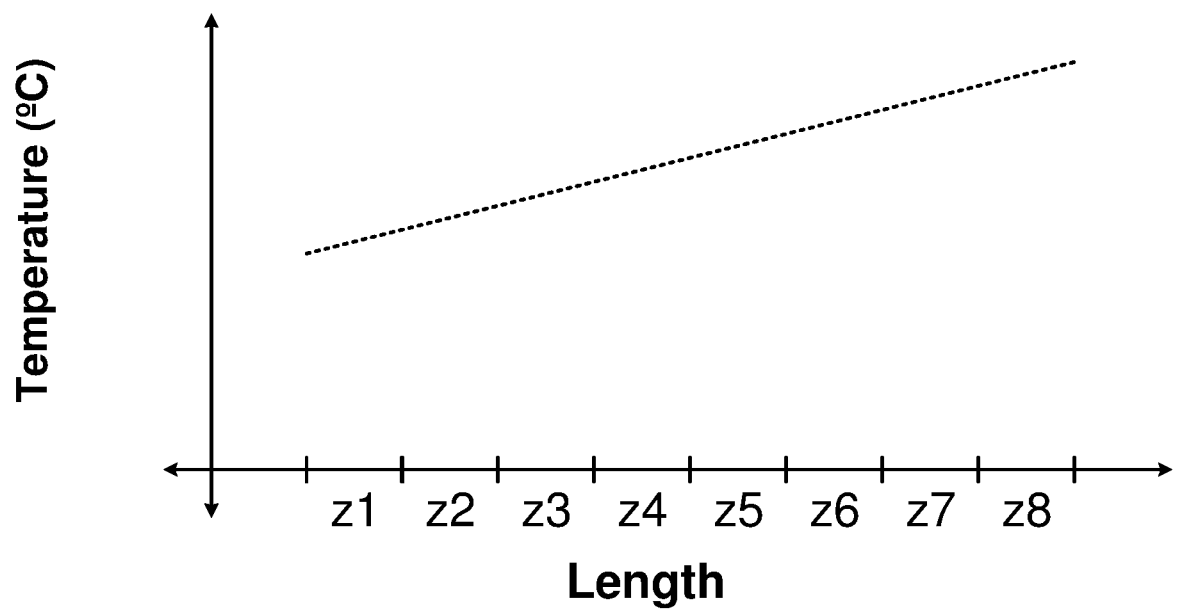
FIG. 3 is a graph illustrating temperature as a function of length along a gas flow path to a processing chamber.

Referring now to FIG. 3, a graph illustrates ideal temperature as a function of length along a gas flow path to a processing chamber. In some applications, it is desirable for the temperature of the gas flow path to monotonically increase as the gas traverses the plurality of heater zones 250. If the temperature decreases, condensation can occur. In FIG. 3, an ideal temperature characteristic is shown as a straight line having a positive slope. In practice, however, the temperature of the gas flowing through the gas flow path is less ideal due to localized cooling or heating. For example, gas cools as it flows through pressure drop/expansion locations.

Figure 4:
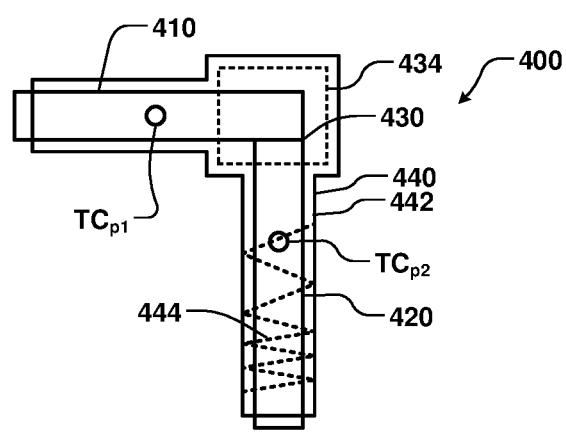
FIG. 4 illustrates an example of a heater zone including a thermocouple.

Referring now to FIG. 4, illustrates an example of a heater zone 400. The heater zone 400 includes a first gas line 410 that is connected to a second gas line 420 at a node 430 located adjacent to a bend/fitting 434. An insulated heater 440 includes an insulating material 442 and a heater element 444. Thermocouples may be used to monitor a temperature of each of the heater zones. For example, a thermocouple TC can be arranged in a first position $TC_{p1}$ or a second position $TC_{p2}$. However, different temperature control characteristics will occur depending upon the selected location of the thermocouple TC.

Figure 5:
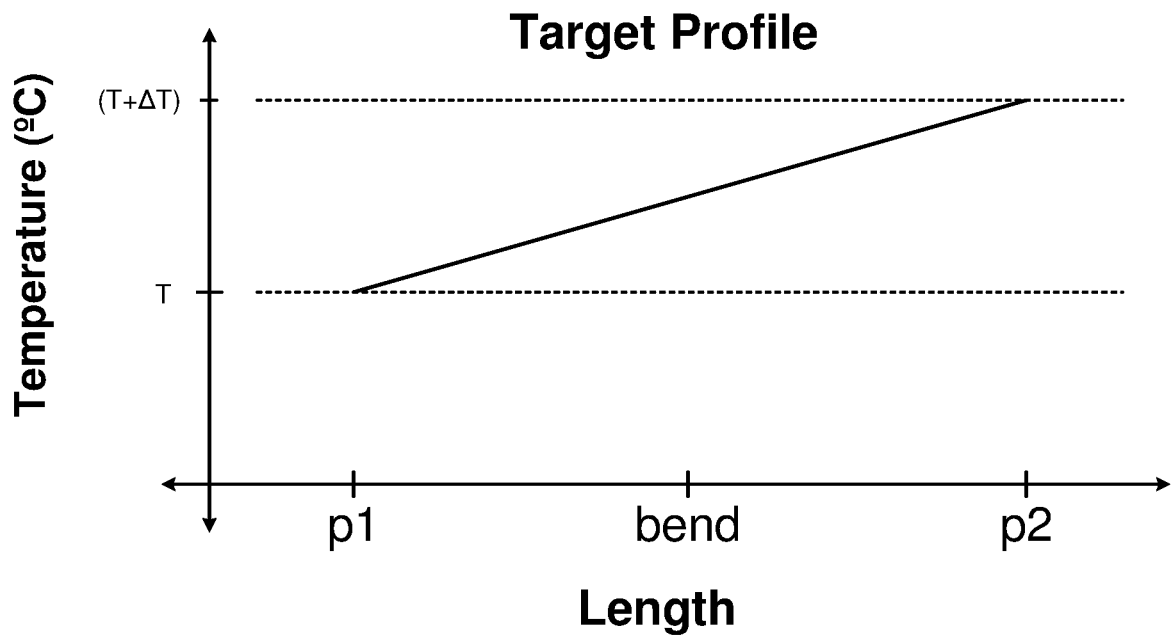
FIGS. 5 and 6 are graphs illustrating temperature as a function of length along a gas flow path in a zone.
Figure 6:
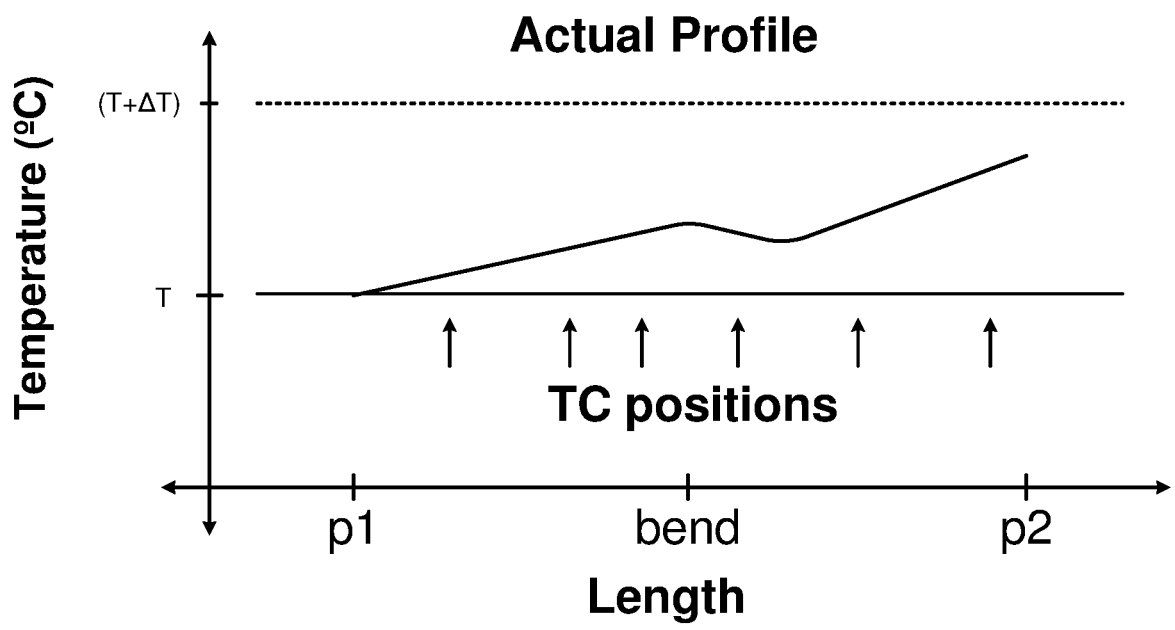

Referring now to FIGS. 5 and 6, graphs illustrate temperature as a function of length along a gas flow path in a zone. In FIG. 5, a target temperature profile monotonically increases from one end of a zone to another. However, in FIG. 6, the temperature may decrease due to pressure drop/expansion locations. How the temperature will be controlled will vary depending upon where the thermocouple is located. Controlling heat when the thermocouple is located after the pressure drop/expansion locations (such as $TC_{p2}$) will cause a higher overall temperature and may lead to temperature drops in other zones that follow. Controlling heat when the thermocouple is located before the pressure drop/expansion locations (such as $TC_{p1}$) will cause a lower overall temperature and may lead to temperature drops in the heater zone.

Figure 8:
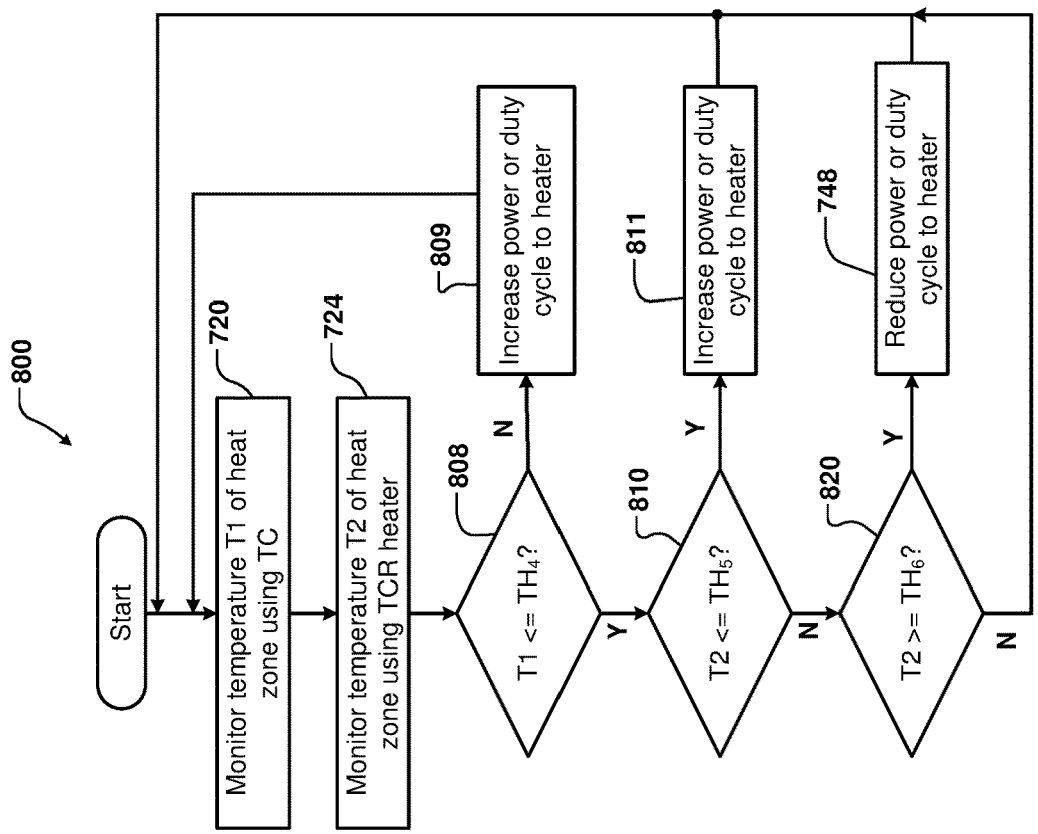
FIGS. 7 and 8 are flowcharts illustrating examples of methods for controlling temperature in a gas flow path using a thermocouple and a TCR heater in each of the heater zones according to the present disclosure.
Figure 7:
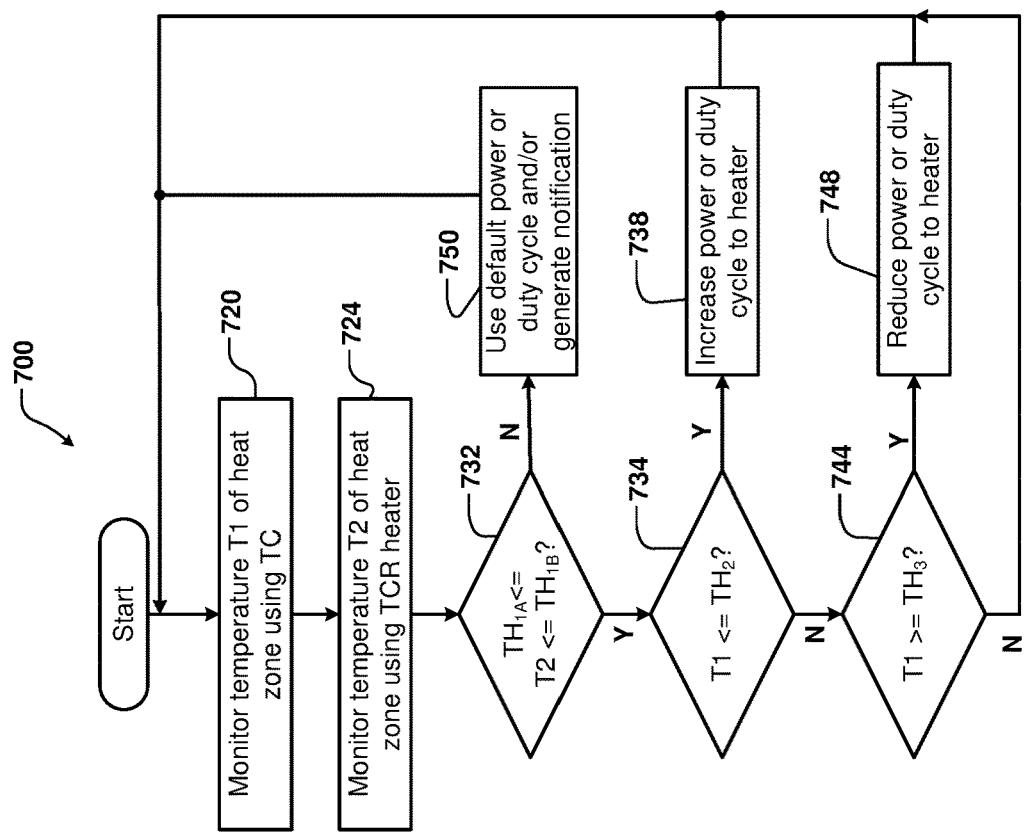

Referring now to FIGS. 7 and 8 are flowcharts illustrating examples of methods for controlling temperature in a gas flow path using a thermocouple and a TCR heater in each of the heater zones. In FIG. 7, a method 700 uses the temperature measurement from the thermocouple as the primary control and the average temperature sensed by the TCR heater is used as an stop limit or override. At 720, the method monitors the temperature T1 of the heater zone using the thermocouple. At 724, the method monitors the temperature T2 of the heater zone using the TCR heater. In some examples, the temperature T2 is determined based upon the resistance of the TCR heater. The resistance is determined by measuring the current and voltage and/or estimating the resistance based on the duty cycle.

At 732, the method determines whether $TH_{1A} \leq T2 \leq TH_{1B}$, which may correspond to upper and lower limit values In other examples, additional checks can be performed. For example, the method may also determine whether a difference between the first and second temperatures is less than or equal to a predetermined temperature threshold. In some examples, an absolute value of the difference between T1 and T2 is compared to the predetermined temperature threshold.

If 732 is true, the method continues with 734. At 734, the method determines whether the temperature T1 is less than or equal to a temperature threshold $TH_2$. If 734 is true, the method continues at 738 and increases power or duty cycle to the TCR heater. If 734 is false, the method continues at 744 and determines whether the temperature T1 is greater than or equal to a temperature threshold $TH_3$. If 744 is true, the method reduces power or the duty cycle to the TCR heater at 748. The method continues from 738 and 748 with 720. If 732 is false, the method overrides control using the thermocouple and uses a default power or duty cycle at 750. The method also may generate an override notification.

In FIG. 8, a method 800 uses the average temperature measurement from the TCR heater as the primary control and the temperature sensed by the thermocouple is used as an override. At 808, the method determines whether the local temperature T1 is less than or equal to a temperature threshold $TH_4$. In other examples, additional temperature checks can be performed. If 808 is false, the method continues at 809 and increases power or duty cycle to the TCR heater.

At 810, the method determines whether the temperature T2 is less than or equal to a temperature threshold $TH_5$. If 810 is true, the method continues at 811 and increases power or duty cycle to the TCR heater. If 810 is false, the method continues at 820 and determines whether the temperature T2 is greater than or equal to a temperature threshold $TH_6$. If 820 is true, the method reduces power or duty cycle to the TCR heater at 748.

Figure 9:
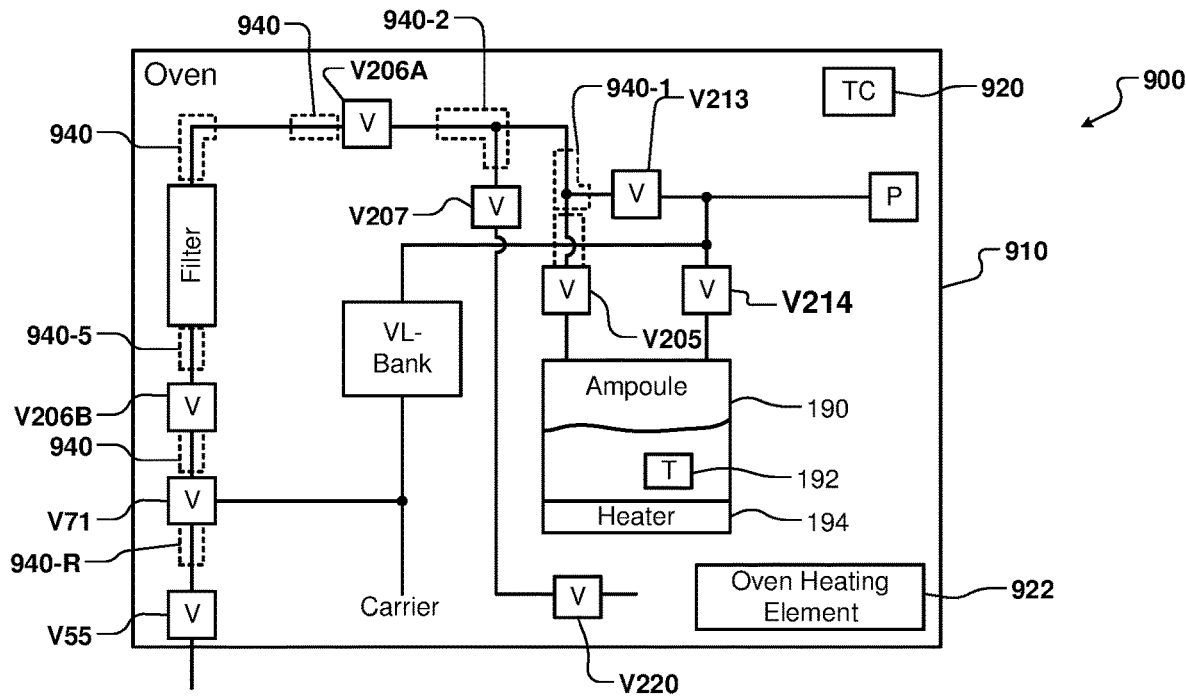
FIG. 9 is a functional block diagram of a heating system including an oven enclosing a gas flow path and uninsulated TCR heaters arranged in one or more locations.

Referring now to FIG. 9, a heating system 900 for a gas delivery system including an oven 910 enclosing one or more components of a substrate processing system. In some examples, the components include components of a gas delivery system and/or a gas flow path. A thermocouple 920 and one or more oven heating elements 922 may be arranged in the oven 910 and are used to maintain an average temperature inside of the oven 910.

As described above, local cooling and/or heating of components within the substrate processing system may occur. For example, gas lines may experience local cooling due to factors such as gas expansion through fittings, valves, etc. While the oven maintains the average temperature in the oven, TCR heaters 940-1, 940-2, . . . , and 940-R (collectively TCR heaters 940) (where R is an integer greater than one) are arranged at locations (such as on portions of the components) where temperature variations (such as cooling) are likely to occur as shown. When the localized cooling occurs, the TCR heaters 940 provide heat to attempt to maintain the temperature at the predetermined temperature despite the localized cooling. Examples of locations may include pressure drop/expansion locations or other locations where localized heating variations may occur.

In some examples, the TCR heaters 940 are uninsulated. In other words, when the TCR heaters 940 are not being operated, the location of the TCR heater 940 will be heated by the oven.

In some examples, one of the TCR heaters 940 is designated as a reference TCR heater and others of the TCR heaters 940 are controlled based upon corresponding ratios of the resistance of the TCR heaters to the resistance of the reference TCR heater. The resistance ratios can be maintained between the reference TCR heater 940 and the other ones of the TCR heaters 940. The resistance ratios can be determined when all of the TCR heaters 940 are at the same reference temperature (such as ambient temperature or another temperature). In some examples, the TCR heaters 940 are made using the same material for the resistive element of the TCR heater 940. Therefore, the resistive ratios should remain relatively constant at other temperatures since all of the TCR heaters should have approximately the same slope (temperature as a function of resistance).

In other words, the resistance ratios of $R_2/R_1$, $R_3/R_1$, $R_4/R_1$, . . . , and $R_R/R_1$ are determined at a predetermined temperature where all of the TCR heaters 940 are at the same temperature. In some examples, the predetermined temperature for determining the ratios is ambient temperature. During operation, the resistances of each of the TCR heaters 940 are measured and the predetermined ratios are maintained by a controller that varies output power to each of the TCR heaters 940. Alternately, a plurality of TCR heater zones may be sequentially arranged along a gas flow path from the source of the gas to the outlet of the oven and/or to the processing chamber (for example, similar to the heater zones shown in FIG. 2A). Additional details relating to controlling resistive ratios of TCR heaters can be found in commonly-assigned U.S. Provisional Patent Application Ser. No. 62/694,171 filed on Jul. 5, 2018, which is hereby incorporated by reference in its entirety.

Control can be performed using a control system similar to those shown in FIGS. 2B and 2C. In this example, the TC 920 monitors the average temperature in the oven 910. The controller 280 stores the resistive ratios of the TCRs and controls the power output to the TCR heaters based thereon. In some examples, the resistive ratios of the TCRs are maintained by the controller 280 to maintain uniform temperature in each of the heater zones. In other examples, the controller 280 further adjusts the resistive ratios of the TCRs depending on position. For example, the controller 280 adds incremental values to the resistive ratios of the TCRs adjust the resistive ratios of the TCRs incrementally. This approach can be used to achieve a progressively increasing temperature of the gas lines in a direction from the source towards the processing chamber.

Figure 10:
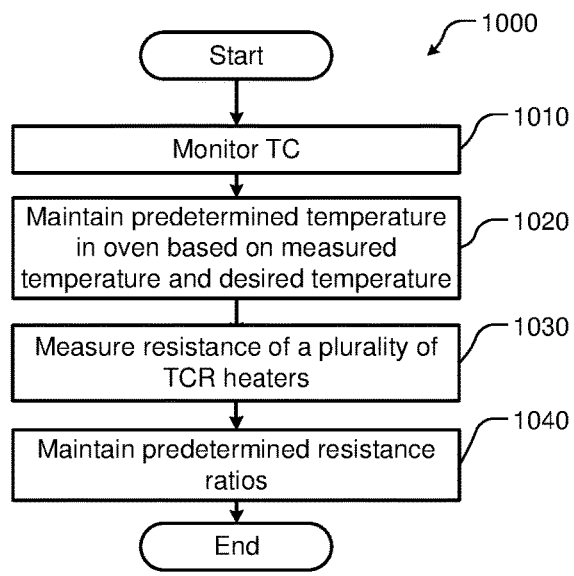
FIG. 10 is a flowchart of a method for operating the heating system of FIG. 9.

Referring now to FIG. 10, a method 1000 for operating the heating system 900 of FIG. 9 is shown. At 1010, a temperature of the oven is monitored using the thermocouple. At 1020, a predetermined temperature is maintained in the oven based upon the measured temperature and a desired temperature. At 1030, resistances of the plurality of TCR heaters are measured. At 1040, predetermined resistance ratios are maintained between the reference TCR heater and other ones of the heaters by varying power supplied to the heater zones.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A heater control system for heating components of a substrate processing system, comprising:
   N heater zones, where N is an integer greater than one, wherein each of the N heater zones heats a component of the substrate processing system and includes:
   a resistive heater; and
   a temperature sensor to sense a local temperature in a corresponding one of the N heater zones; and a controller configured to:
  determine an average temperature of each of the N heater zones based on a resistance of the resistive heater in each of the N heater zones, and
  control the resistive heater based on the average temperature and the local temperature in each of the N heater zones.

2. The heater control system of claim 1, wherein the controller is configured to selectively control power supplied to the resistive heater in each of the N heater zones based on the local temperature and selectively override power supplied to the resistive heater in each of the N heater zones based on the average temperature.

3. The heater control system of claim 1, further comprising a current sensor to sense current supplied to each of the N heater zones, wherein the controller determines the resistance of each of the N heater zones based thereon.

4. The heater control system of claim 1, further comprising a voltage sensor to sense voltage supplied to each of the N heater zones, wherein the controller determines the resistance of each of the N heater zones based thereon.

5. The heater control system of claim 1, further comprising:
  a heater driver to drive the resistive heater of one of the N heater zones using a fixed voltage and a current variable at a duty cycle or using a fixed current and a voltage variable at the duty cycle; and
  a resistance estimator to estimate the resistance of the resistive heater of the one of the N heater zones based on the fixed voltage and the current variable at the duty cycle or based on the fixed current and the voltage variable at the duty cycle,
  wherein the controller determines the average temperature of the one of the N heater zones based on the resistance.

6. The heater control system of claim 1, wherein the controller is configured to:
  selectively control power supplied to the resistive heater in each of the N heater zones based on the local temperature; and
  selectively override power supplied to the resistive heater in each of the N heater zones when the average temperature is outside of a predetermined temperature range.

7. The heater control system of claim 6, wherein the controller is configured to control the power supplied to the resistive heater in each of the N heater zones based on at least one of a default duty cycle and a default power level when the average temperature is outside of the predetermined temperature range.

8. The heater control system of claim 1, wherein the controller is configured to:
  selectively control power supplied to the resistive heater in each of the N heater zones based on the average temperature; and
  selectively override power supplied to the resistive heater in each of the N heater zones based on the local temperature.

9. The heater control system of claim 8, wherein the controller is configured to increase power supplied to the resistive heater in each of the N heater zones when the local temperature is less than a predetermined temperature.

10. The heater control system of claim 1, wherein the N heater zones are arranged around gas lines from a source to a processing chamber, and wherein the N heater zones provide a progressive heating profile from the source to the processing chamber.

* * * * *